(12) United States Patent
Yamamoto et al.

(10) Patent No.: US 7,915,705 B2
(45) Date of Patent: Mar. 29, 2011

(54) SiC SEMICONDUCTOR DEVICE HAVING OUTER PERIPHERY STRUCTURE

(75) Inventors: Takeo Yamamoto, Nishikamo-gun (JP); Eiichi Okuno, Mizuho (JP)

(73) Assignee: Denso Corporation, Kariya (JP)

( * ) Notice: Subject to any disclaimer, the term of this patent is extended or adjusted under 35 U.S.C. 154(b) by 306 days.

(21) Appl. No.: 12/076,871

(22) Filed: Mar. 25, 2008

(65) Prior Publication Data
US 2008/0258152 A1 Oct. 23, 2008

(30) Foreign Application Priority Data

Apr. 18, 2007 (JP) ................ 2007-109223

(51) Int. Cl.
*H01L 29/021* (2006.01)
(52) U.S. Cl. .......... 257/496; 257/77; 257/492; 257/493; 257/E21.054; 257/E21.065; 257/E29.006; 257/E29.007
(58) Field of Classification Search .............. 257/77, 257/E21.054, E21.065, E29.006, E29.007, 257/492, 493, 496
See application file for complete search history.

(56) References Cited

U.S. PATENT DOCUMENTS

| | | | | |
|---|---|---|---|---|
| 6,979,863 | B2 * | 12/2005 | Ryu ........................... | 257/335 |
| 2004/0173820 | A1 * | 9/2004 | Kinoshita et al. ............. | 257/200 |
| 2005/0045892 | A1 * | 3/2005 | Hayashi et al. ............... | 257/77 |
| 2006/0065899 | A1 * | 3/2006 | Hatakeyama et al. ......... | 257/77 |

FOREIGN PATENT DOCUMENTS

| JP | A-2003-158259 | 5/2003 |
|---|---|---|
| JP | A-2004-335815 | 11/2004 |

OTHER PUBLICATIONS

Kinoshita et al., "Guard Ring Assisted RESURF: A New Termination Structure Providing Stable and High Breakdown Voltage for SiC Power Devices", Tech. Digest of ISPSD '02, pp. 253-256.*
Office action from Japan Patent Office dated Apr. 22, 2009 in the corresponding JP Application No. 2007-109223 (and English Translation).

* cited by examiner

*Primary Examiner* — Jerome Jackson, Jr.
*Assistant Examiner* — Jay C Kim
(74) *Attorney, Agent, or Firm* — Posz Law Group, PLC (57) ABSTRACT

A SiC semiconductor device includes: a SiC substrate; a SiC drift layer on the substrate having an impurity concentration lower than the substrate; a semiconductor element in a cell region of the drift layer; an outer periphery structure including a RESURF layer in a surface portion of the drift layer and surrounding the cell region; and an electric field relaxation layer in another surface portion of the drift layer so that the electric field relaxation layer is separated from the RESURF layer. The electric field relaxation layer is disposed on an inside of the RESURF layer so that the electric field relaxation layer is disposed in the cell region. The electric field relaxation layer has a ring shape.

6 Claims, 8 Drawing Sheets

SIC SEMICONDUCTOR DEVICE HAVING OUTER PERIPHERY STRUCTURE

CROSS REFERENCE TO RELATED APPLICATION

This application is based on Japanese Patent Application No. 2007-109223 filed on Apr. 18, 2007, the disclosure of which is incorporated herein by reference.

FIELD OF THE INVENTION

The present invention relates to a SiC semiconductor device having an outer periphery structure.

BACKGROUND OF THE INVENTION

A high breakdown voltage semiconductor device such as a SBD (i.e., Schottky barrier diode), a PN diode, a MOSFET and an IGBT has a RESURF (i.e., reduced surface field) structure or a guard ring structure as an outer end structure disposed on an outer periphery region. The device is disclosed in, for example, JP-2004-335815.

Figure 10:
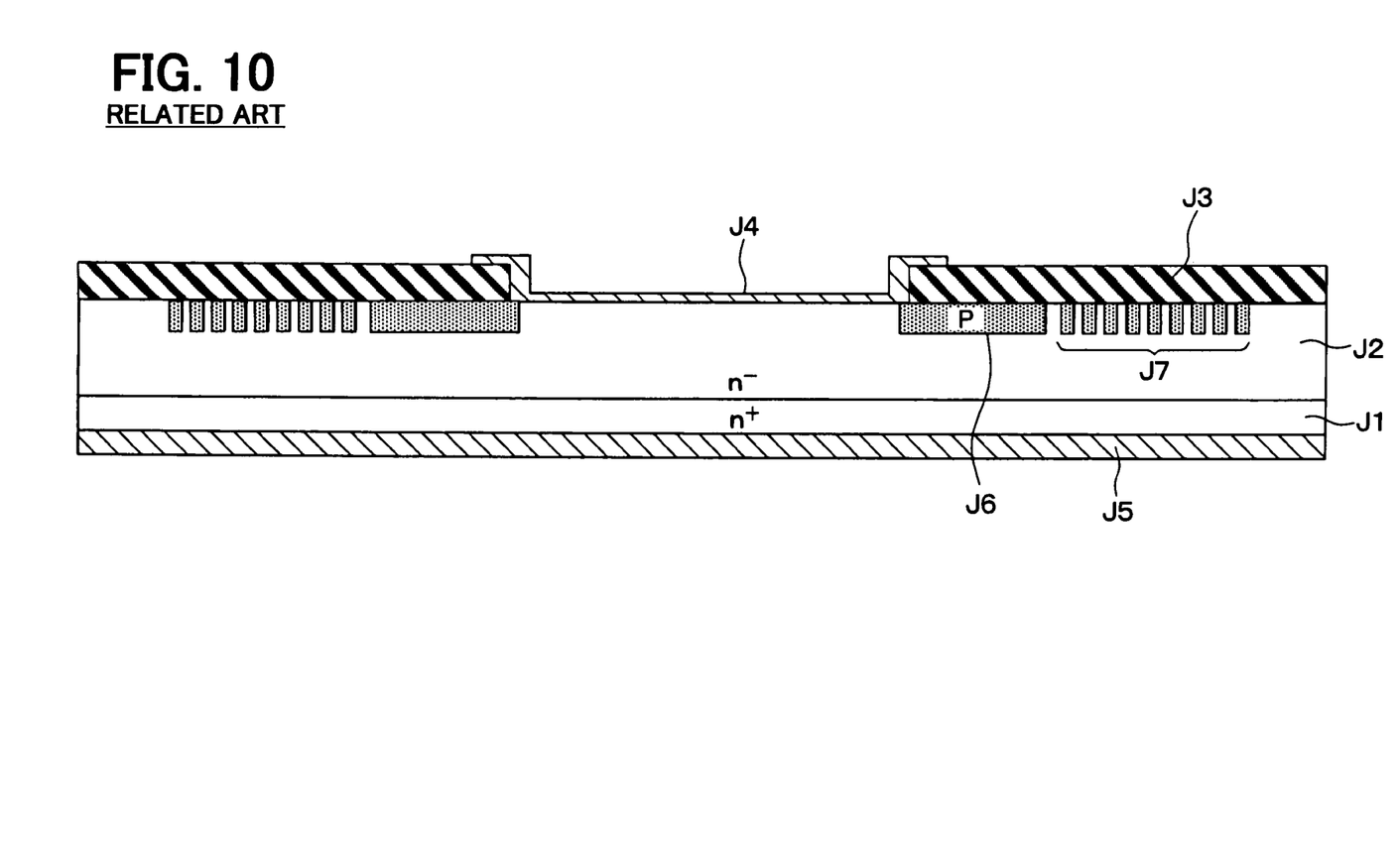
FIG. 10 is a cross sectional view showing a SiC semiconductor device having a SBD according to a related art.

FIG. 10 shows a SiC semiconductor device having a SBD as a related art. The device includes an $N^+$ conductive type substrate J1, an $N^-$ conductive type drift layer J2, an insulation film J3, a Schottky electrode J4 and an ohmic electrode J5. The drift layer J2 is disposed on the substrate J1. The insulation film J3 is formed on the surface of the drift layer J2, and has an opening. The Schottky electrode J4 is formed in the opening of the insulation film J3 so that the Schottky electrode J4 contacts the drift layer J2. The ohmic electrode J5 is formed on the backside of the substrate J1 so that the ohmic electrode J5 contacts the substrate J1. Thus, the SBD is formed.

The outer end structure of the SBD includes a P conductive type RESURF layer J6 and a plurality of P conductive type guard ring layers J7. Specifically, the RESURF layer J6 and the guard ring layers J7 are disposed on both sides of the Schottky electrode J4 such that the RESURF layer J6 contacts the Schottky electrode J4. The RESURF layer J6 is disposed in a surface portion of the drift layer J2. The guard ring layers J7 are disposed on the outer periphery of the RESURF layer J6 so that the guard ring layers J7 surround the SBD. By forming the RESURF layer J6 and the guard ring layers J7, electric field extends toward the outer periphery of the SBD so that electric field concentration is reduced. Thus, breakdown voltage of the device is improved.

However, when the outer end structure is made of, for example, aluminum, which has a low diffusion coefficient, concentration profile rapidly changes from the outer end structure to a part of the drift layer J2 adjacent to the outer end structure. Accordingly, electric field concentrates at a part of the outer end structure disposed on utmost inner side (i.e., utmost semiconductor device side or utmost cell side) such as an inner portion of the RESURF layer J6 when a reverse voltage is applied to the device. Thus, the device may break down, and the breakdown voltage of the device is reduced.

SUMMARY OF THE INVENTION

In view of the above-described problem, it is an object of the present disclosure to provide a SiC semiconductor device having an outer periphery structure.

According to a first aspect of the present disclosure, a SiC semiconductor device includes: a substrate made of SiC and having a first conductive type, wherein the substrate includes a first surface and a second surface; a drift layer disposed on the first surface of the substrate, wherein the drift layer is made of SiC and has the first conductive type, and the drift layer has an impurity concentration lower than that of the substrate; a semiconductor element disposed in a cell region of the drift layer; an outer periphery structure disposed on an outer periphery of the cell region, wherein the outer periphery structure includes a RESURF layer having a second conductive type, and the RESURF layer is disposed in a surface portion of the drift layer and surrounds the cell region; and an electric field relaxation layer having the second conductive type, wherein the electric field relaxation layer is disposed in another surface portion of the drift layer so that the electric field relaxation layer is separated from the RESURF layer, the electric field relaxation layer is disposed on an inside of the RESURF layer so that the electric field relaxation layer is disposed in the cell region, and the electric field relaxation layer has a ring shape.

When a reverse voltage is applied to the device, an electric field extends under the relaxation layer. Thus, electric field concentration at an edge of the RESURF layer is reduced, so that a breakdown voltage of the device is improved. Thus, the above device has high breakdown voltage.

Alternatively, the electric field relaxation layer may include a plurality of concentric layers, each of which is disposed on the inside of the RESURF layer, and the plurality of concentric layers are spaced apart from each other. Further, the plurality of concentric layers may include an utmost outer concentric layer, which is disposed on utmost outer side of the electric field relaxation layer. The utmost outer concentric layer contacts an edge of the RESURF layer or is provided by a part of the RESURF layer, and the edge of the RESURF layer is disposed on utmost inner side of the RESURF layer.

Alternatively, each concentric layer may have a depth, and the depth of the concentric layer disposed on an inner side of the electric field relaxation layer is shallower than that disposed on an outer side of the electric field relaxation layer.

Alternatively, the electric field relaxation layer may have an impurity concentration profile in such a manner that an impurity concentration of the electric field relaxation layer becomes smaller as a depth of the electric field relaxation layer becomes larger.

According to a second aspect of the present disclosure, a SiC semiconductor device includes: a substrate made of SiC and having a first conductive type, wherein the substrate includes a first surface and a second surface; a drift layer disposed on the first surface of the substrate, wherein the drift layer is made of SiC and has the first conductive type, and the drift layer has an impurity concentration lower than that of the substrate; a semiconductor element disposed in a cell region of the drift layer; an outer periphery structure disposed on an outer periphery of the cell region, wherein the outer periphery structure includes a RESURF layer having a second conductive type, and the RESURF layer is disposed in a surface portion of the drift layer and surrounds the cell region; and an electric field relaxation layer having the second conductive type, wherein the electric field relaxation layer is disposed in another surface portion of the drift layer, the electric field relaxation layer is disposed on an inside of the RESURF layer so that the electric field relaxation layer is disposed in the cell region, the electric field relaxation layer has a tapered shape so that a depth of the electric field relaxation layer becomes shallower with going toward a center of the cell region, and the electric field relaxation layer has a ring shape.

When a reverse voltage is applied to the device, an electric field extends under the relaxation layer. Thus, electric field concentration at an edge of the RESURF layer is reduced, so that a breakdown voltage of the device is improved. Thus, the above device has high breakdown voltage.

Alternatively, the electric field relaxation layer may contact an edge of the RESURF layer so that the electric field relaxation layer is provided by extension of the RESURF layer, and the edge of the RESURF layer is disposed on utmost inner side of the RESURF layer.

According to a third aspect of the present disclosure, a SiC semiconductor device includes: a substrate made of SiC and having a first conductive type, wherein the substrate includes a first surface and a second surface; a drift layer disposed on the first surface of the substrate, wherein the drift layer is made of SiC and has the first conductive type, and the drift layer has an impurity concentration lower than that of the substrate; a semiconductor element disposed in a cell region of the drift layer; an outer periphery structure disposed on an outer periphery of the cell region, wherein the outer periphery structure includes a RESURF layer having a second conductive type, and the RESURF layer is disposed in a surface portion of the drift layer and surrounds the cell region; and an electric field relaxation layer having the second conductive type, wherein the electric field relaxation layer is disposed in another surface portion of the drift layer, the electric field relaxation layer is disposed on an inside of the RESURF layer so that the electric field relaxation layer is disposed in the cell region, the electric field relaxation layer has an impurity concentration, which becomes smaller with going deeper and with going toward a center of the cell region, and the electric field relaxation layer has a ring shape.

When a reverse voltage is applied to the device, an electric field extends under the relaxation layer. Thus, electric field concentration at an edge of the RESURF layer is reduced, so that a breakdown voltage of the device is improved. Thus, the above device has high breakdown voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
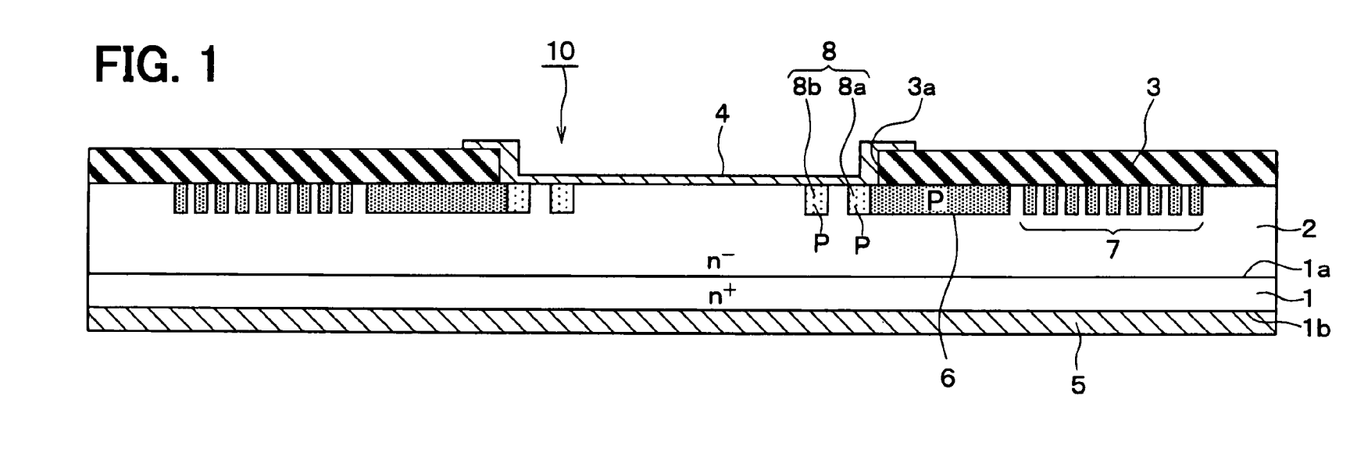
FIG. 1 is a cross sectional view showing a SiC semiconductor device having a SBD according to a first embodiment.
Figure 2:
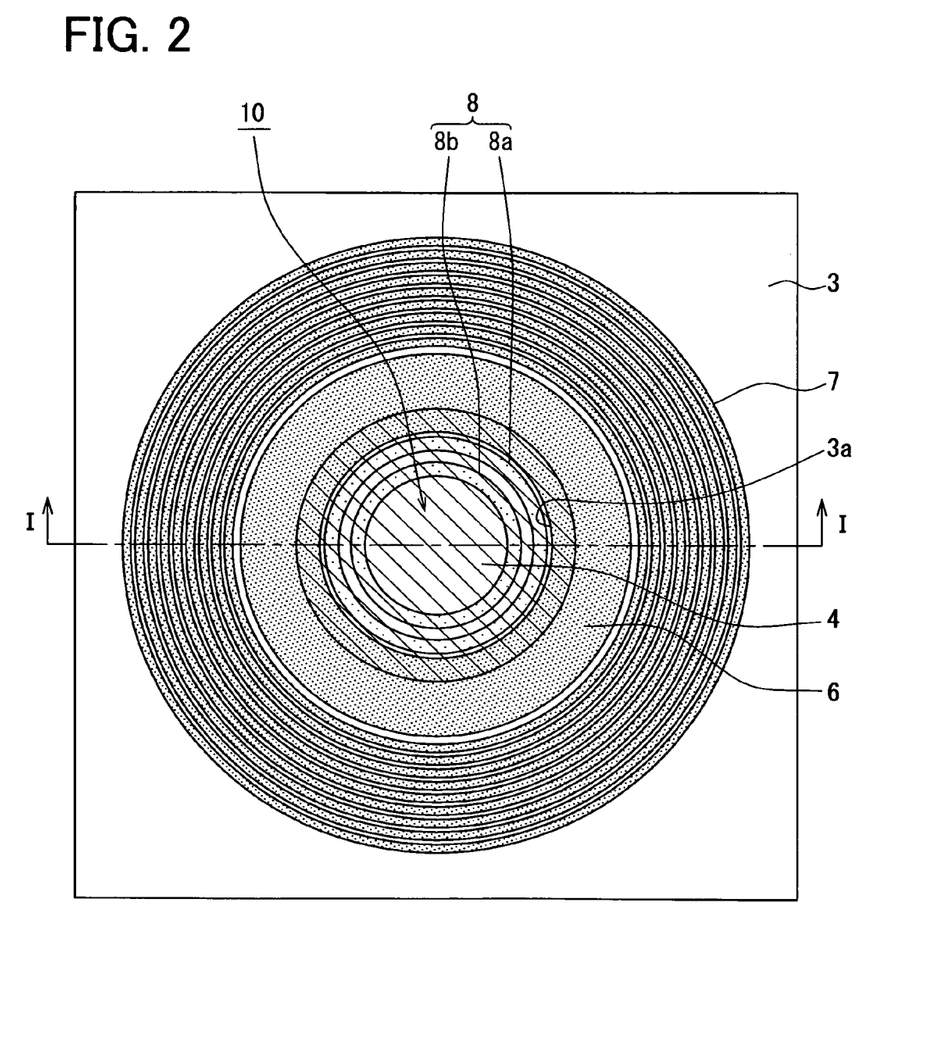
FIG. 2 is a plan view showing the SiC semiconductor device shown in FIG. 1.

FIG. 1 shows a SiC semiconductor device having a SBD 10 taken along line I-I in FIG. 2. FIG. 2 is a plan view showing the device.

The device is made from an N$^+$ conductive type substrate 1. The substrate is a SiC substrate having an impurity concentration between $2 \times 10^{18}$ cm$^{-3}$ and $1 \times 10^{21}$ cm$^{-3}$. The substrate 1 has a principal surface 1a and a backside surface 1b, which is opposite to the principal surface 1a. A N$^-$ conductive type drift layer 2 is formed on the principal surface 1a of the substrate 1. The impurity concentration of the drift layer 2 is lower than that of the substrate 1. For example, the impurity concentration of the drift layer 2 is in a range between $1 \times 10^{15}$ cm$^{-3}$ and $5 \times 10^{16}$ cm$^{-3}$. The drift layer 2 is made of SiC. The SBD 10 is formed in a cell region, and an outer end structure is formed in an outer periphery region.

Specifically, an insulation film 3 is formed on the drift layer 2. The insulation film 3 has an opening 3a, which is disposed in the cell region. The insulation film 3 is made of a silicon oxide film. The Schottky electrode 4 is formed in the opening 3a of the insulation film 3 so that the Schottky electrode 4 contacts the drift layer 2. The Schottky electrode 4 is made of molybdenum, titanium or nickel. The opening 3a of the insulation film 3 has a circular shape. The Schottky electrode 4 is Schottky connected to the drift layer 2 at the opening 3a. The ohmic electrode 5 is formed on the backside of the substrate 1 so that the ohmic electrode 5 contacts the substrate 1. The ohmic electrode 5 is made of nickel, titanium, molybdenum, tungsten or the like. Thus, the SBD 10 is formed.

The outer end structure disposed on the outer periphery region of the SBD 10 includes a P conductive type RESURF layer 6, multiple P conductive type guard ring layers 7 and the like, which are disposed on both sides of the Schottky electrode 4. The RESURF layer 6 contacts the Schottky electrode 4, and formed in a surface portion of the drift layer 2. The guard ring layers 7 are disposed on the outside of the RESURF layer 6 so that the guard ring layers 7 surround the RESURF layer 6. The RESURF layer 6 includes, for example, an Al impurity. The impurity concentration of the RESURF layer 6 is in a range between $5 \times 10^{16}$ cm$^{-3}$ and $1 \times 10^{18}$ cm$^{-3}$. Each of the RESURF layer 6 and the guard ring layers 7 has a ring shape, as shown in FIG. 2, so that the RESURF layer 6 and the guard ring layers 7 surround the cell region. By forming the RESURF layer 6 and the guard ring layers 7, the electric field extends widely in the outer periphery region of the SBD 10. Thus, the electric field concentration is reduced, so that the breakdown voltage of the device is improved.

Further, a P conductive type electric field relaxation layer 8 is disposed on an inside of the RESURF layer 6. Specifically, the relaxation layer 8 is disposed on an inside of an edge of the RESURF layer 6, which is disposed on utmost inner side of the RESURF layer 6. The edge of the RESURF layer 6 is disposed on utmost inner side of the outer end structure so that the edge is disposed on a cell side. The relaxation layer 8 has a circular ring shape along with an outer periphery of the cell region, i.e., an outer periphery of the Schottky electrode 4. The relaxation layer 8 includes multiple concentric layers 8a, 8b. In FIG. 1, the number of the concentric layers 8a, 8b is two. Each concentric layer 8a, 8b has an impurity concentration between $5 \times 10^{17}$ cm$^{-3}$ and $5 \times 10^{20}$ cm$^{-3}$. The width of the concentric layer 8a, 8b along with a radial direction is in a range between 0.5 μm and 2.0 μm. The distance between the concentric layers 8a, 8b is in a range between 0.5 μm and 2.5 μm. The depth of the concentric layer 8a, 8b is in a range between 0.3 μm and 1.0 μm.

The outer concentric layer 8a disposed on utmost outer side of the relaxation layer 8 contacts the RESURF layer 6 or is included in the inside of the RESURF layer 6. The inner concentric layer 8b disposed on the inner side of the outer concentric layer 8a is spaced apart from the outer concentric layer 8a by a predetermined distance therebetween.

In the SiC semiconductor device having the SBD 10, the Schottky electrode provides an anode, and the ohmic electrode 5 provides a cathode. When a voltage larger than a Schottky threshold is applied to the Schottky electrode 4, current flows between the Schottky electrode 4 and the ohmic electrode 5.

In the outer periphery region, the electric field extends under the relaxation layer 8 when a reverse voltage is applied to the device. Accordingly, even when the impurity composing the RESURF layer 6 and the guard ring layer 7 is aluminum or the like, which has a low diffusion coefficient, the electric field concentration at the edge of the RESURF layer 6, which is disposed on utmost inner side of the RESURF layer 6, is relaxed, i.e., reduced. Thus, the breakdown voltage of the device is improved.

A method for manufacturing the device will be explained as follows with reference to FIGS. 3A to 3E. In FIGS. 3A to 3E, the guard ring layer 7 is not shown.

Figure 3A:
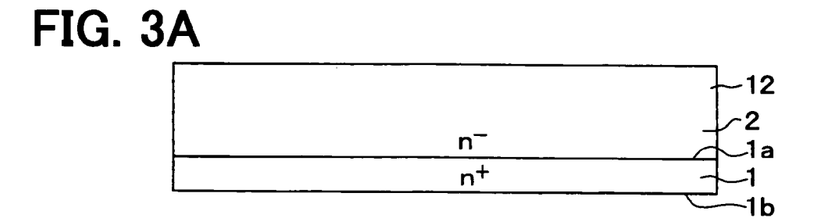
FIGS. 3A to 3E are cross sectional views showing a method for manufacturing the SiC semiconductor device shown in FIG. 1.
Figure 3B:
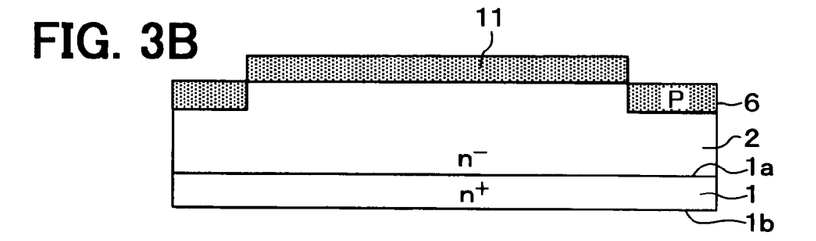

In a step shown in FIG. 3A, the drift layer 2 is epitaxially grown on the principal surface 1a of the substrate 1. In a step shown in FIG. 3B, a mask 11 made of, for example, LTO (i.e., low-temperature oxide) is formed on the substrate 1. Then, the mask 11 is etched by a photo lithography etching method so that the mask 11 has an opening corresponding to the RESURF layer 6 and the guard ring layer 7. Thus, the opening is formed on a RESURF-layer-to-be-formed region and a guard-ring-layer-to-be-formed region of the drift layer 2. A P conductive type impurity such as aluminum is doped in the drift layer 2 with using the mask 11 by an ion implantation method. Then, heat treatment is performed so that the impurity is activated in the drift layer 2. Thus, the RESURF layer 6 and the guard ring layer 7 are formed.

Figure 3C:
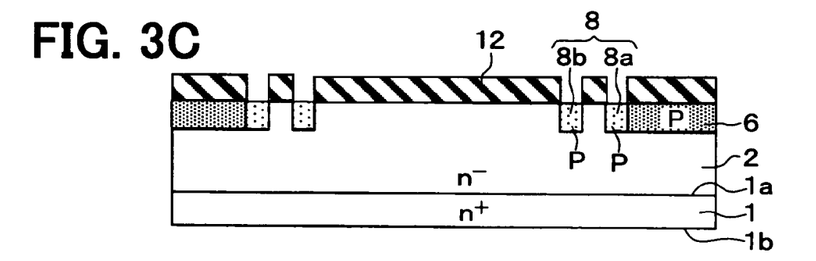
Figure 3D:
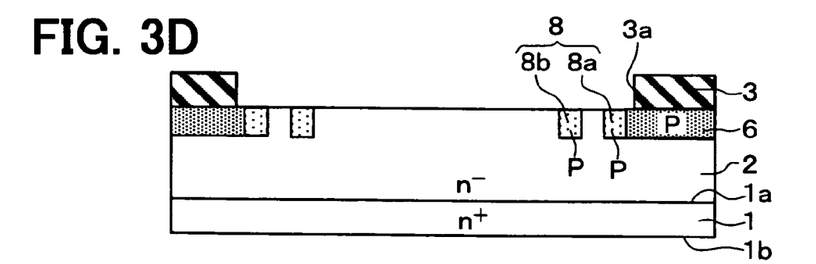

In a step shown in FIG. 3C, the mask 11 is removed. Then, another mask 12 made of, for example, LTO is formed on the substrate 1. The mask 12 is etched by a photo lithography method so that the mask 12 has an opening corresponding to the relaxation layer 8. Specifically, the opening is formed on a relaxation-layer-to-be-formed region of the drift layer 2. A P conductive type impurity such as aluminum is doped in the drift layer 2 with using the mask 12 by an ion implantation method. Then, heat treatment is performed so that the impurity is activated in the drift layer 2. Thus, the relaxation layer 8 is formed. In a step shown in FIG. 3D, the mask 12 is removed. Then, a silicon oxide film is formed on the substrate 1 by a plasma CVD method or the like. Then, the silicon oxide film is processed by a reflow step so that the insulation film 3 is formed. After a photo lithography step, the opening 3a is formed in the insulation film 3.

Figure 3E:
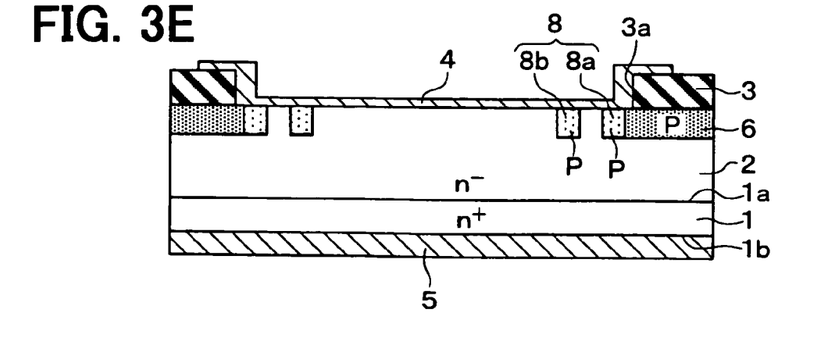

In a step shown in FIG. 3E, a metallic film made of molybdenum, titanium or nickel is formed on the insulation film 3 and in the opening 3a. The metallic film is patterned so that the Schottky electrode 4 is formed. Another metallic layer made of, for example, nickel, titanium, molybdenum, tungsten or the like is formed on the backside surface 1b of the substrate 1 so that the ohmic electrode 5 is formed. Thus, the SiC semiconductor device having the SBD 10 is completed.

In the device, the relaxation layer 8 is formed on the inside of the RESURF layer 6 so as to separate from the RESURF layer 6 by a predetermined distance. Accordingly, when the reverse voltage is applied to the device, the electric field extends under the relaxation layer 8. Thus, even when the impurity composing the RESURF layer 6 and the guard ring layer 7 is aluminum or the like, which has a low diffusion coefficient, the electric field concentration at the edge of the RESURF layer 6, which is disposed on utmost inner side of the RESURF layer 6, is relaxed, i.e., reduced. Thus, the breakdown voltage of the device is improved.

Second Embodiment

Figure 4:
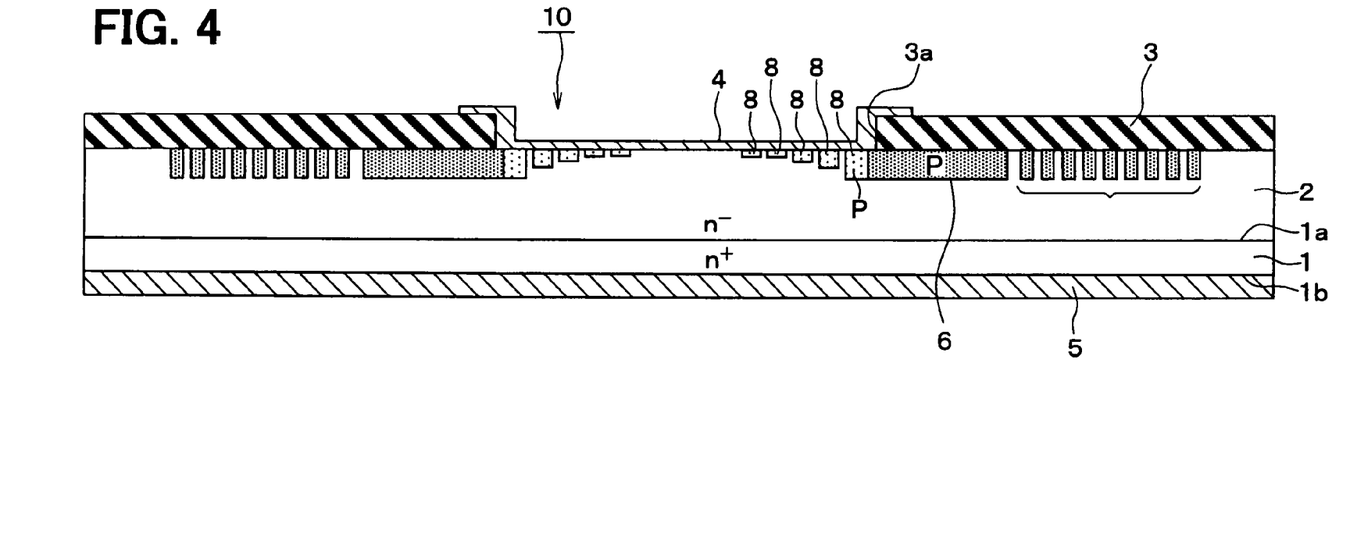
FIG. 4 is a cross sectional view showing a SiC semiconductor device having a SBD according to a second embodiment.

FIG. 4 shows a SiC semiconductor device having the SBD 10 with another relaxation layer 8. The relaxation layer 8 includes multiple concentric layers, which are separated from each other by a predetermined distance. The depth of the concentric layers becomes shallower as it goes to the center of the device from an outer periphery of the SBD 10. In such a case, when the reverse voltage is applied to the device, the electric field extends widely under the relaxation layer 8. Thus, the electric field relaxation of the device is much improved, so that the breakdown voltage of the device increases.

The above device is formed by a process shown in FIGS. 3A to 3E except for a step shown in FIG. 3C. In FIG. 3C, one mask 12 is used for forming the relaxation layer 8 at one time. However, in a step corresponding to FIG. 3C, multiple masks are used so that the concentric layers 8 are formed. The masks have different patterns, and each concentric layer 8 is formed by using one mask. Further, an ion implantation energy in a case where the relaxation layer 8 is formed on an inner side is set to be higher than that in a case where the relaxation layer 8 is formed on an outer side so that an ion implantation depth becomes shallower. Thus, the above device is formed.

Third Embodiment

Figure 5:
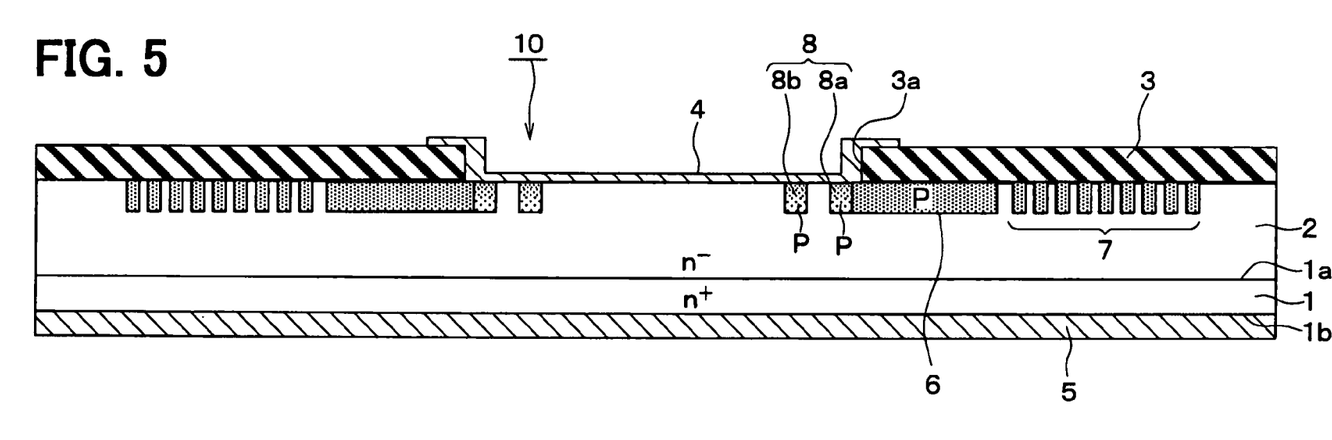
FIG. 5 is a cross sectional view showing a SiC semiconductor device having a SBD according to a third embodiment.

FIG. 5 shows a SiC semiconductor device having the SBD 10. The relaxation layer 8 has multiple concentric layers 8a, 8b, which are separated from each other by a predetermined distance. An impurity concentration profile in each concentric layer 8a, 8b is different from that in FIG. 1. Specifically, the P conductive type impurity concentration near the surface of the drift layer 2 is high, and the concentration decreases as the depth becomes deeper. Thus, the impurity concentration on the Schottky side is higher than that on the bottom side of the concentric layer 8a, 8b.

In such a case, when the reverse voltage is applied to the device, the electric field extends under the relaxation layer 8 and in the inside of the relaxation layer 8. Thus, the electric field relaxation is obtained, so that the breakdown voltage of the device is improved.

The above device is formed by a process shown in FIGS. 3A to 3E except for a step shown in FIG. 3C. In a step corresponding to FIG. 3C, the dose amount of the ion implantation for forming the relaxation layer 8 is controlled in accordance with the depth, so that the dose amount becomes small as the depth becomes deeper. Alternatively, a boron instead of aluminum is shallowly implanted on the drift layer, and then, the boron is diffused toward the deeper position when the heat treatment is performed.

Fourth Embodiment

Figure 6:
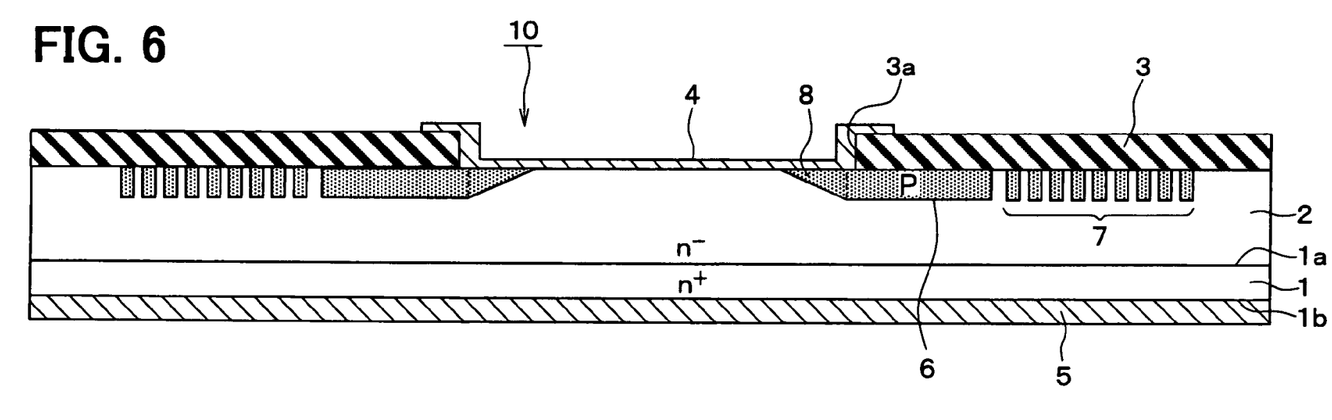
FIG. 6 is a cross sectional view showing a SiC semiconductor device having a SBD according to a fourth embodiment.

FIG. 6 shows a SiC semiconductor device having the SBD 10. The relaxation layer 8 is provided by extending the RESURF layer 6 toward the inside of the device. Specifically, the depth of the relaxation layer 8 becomes shallower as it goes to the center of the device. Thus, the relaxation layer 8 has a slope. In this case, the relaxation layer 8 is formed from a part of the RESURF layer 6, and therefore, the impurity concentration of the relaxation layer 8 is the same as the RESURF layer 6.

In this case, when the reverse voltage is applied to the device, the electric field extends under the relaxation layer 8 widely, so that the electric field relaxation is obtained. Thus, the breakdown voltage is improved.

The above device is manufactured as follows. FIGS. 7A to 7D shows a manufacturing method of the device.

Figure 7A:
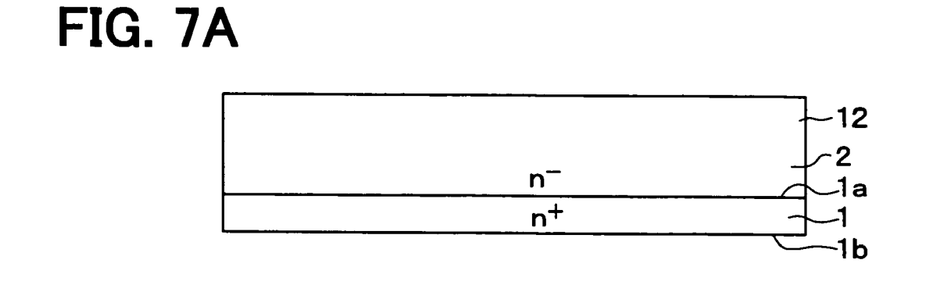
FIGS. 7A to 7D are cross sectional views showing a method for manufacturing the SiC semiconductor device shown in FIG. 6.
Figure 7B:
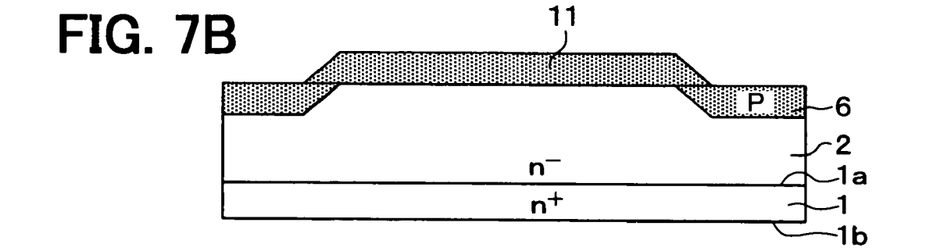

In a step shown in FIG. 7A, the drift layer 2 is epitaxially grown on the principal surface 1a of the substrate 1. In a step shown in FIG. 3B, the mask 11 is formed on the surface of the drift layer 2. Then, the mask 11 is etched by a photo lithography etching method so that the mask 11 has a predetermined pattern. At this time, the mask 11 has a slope corresponding to the relaxation-layer-to-be-formed region of the drift layer 2. Specifically, the slope is disposed on an inner edge of the RESURF-layer-to-be-formed region of the drift layer 2, so that the edge of the mask 11 provides the slope. For example, the opening of the mask 11 corresponding to the RESURF layer 6 and the guard ring layer 7 is formed. In this case, the edge of the mask 11 corresponding to the relaxation layer 8 does not etched so that the edge of the mask 11 does not open. A resist mask (not shown) is formed on the mask 11 such that the resist mask has an opening corresponding to the relaxation-layer-to-be-formed region and a predetermined outer region having a predetermined width and disposed on an outer side of the relaxation-layer-to-be-formed region, and the resist mask covers other regions including the RESURF-layer-to-be-formed region and the guard-ring-layer-to-be-formed region. Then, the mask 11 is etched by an isotropic etching method with using the resist mask so that a part of the mask 11 corresponding to the relaxation-layer-to-be-formed region provides the slope. After that, with using the mask 11, a P conductive type impurity such as Al is implanted, and then, the heat treatment is performed so that the impurity is activated. Thus, the RESURF layer 6 and the guard ring layer 7 are formed together with the relaxation layer 8.

Figure 7C:
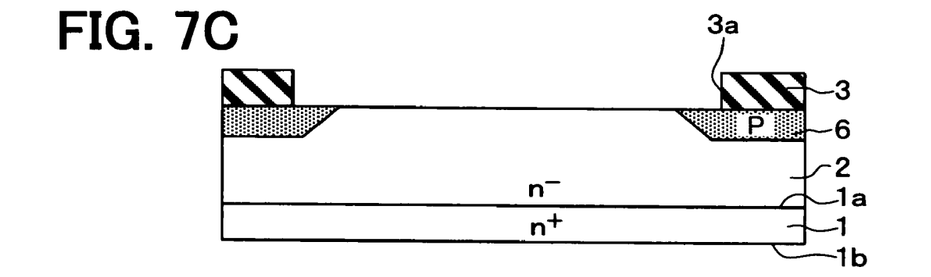

Then, in a step shown in FIG. 7C, the mask 11 is removed. Then, a silicon oxide film is formed on the substrate 1 by a plasma CVD method or the like. Then, the silicon oxide film is processed by a reflow step so that the insulation film 3 is formed. After a photo lithography step, the opening 3a is formed in the insulation film 3.

Figure 7D:
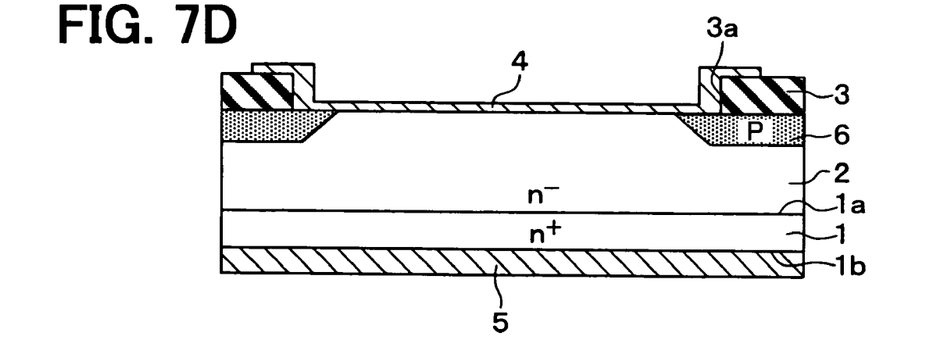

In a step shown in FIG. 7D, a metallic film made of molybdenum, titanium or nickel is formed on the insulation film 3 and in the opening 3a. The metallic film is patterned so that the Schottky electrode 4 is formed. Another metallic layer made of, for example, nickel, titanium, molybdenum, tungsten or the like is formed on the backside surface 1b of the substrate 1 so that the ohmic electrode 5 is formed. Thus, the SiC semiconductor device having the SBD 10 is completed.

Fifth Embodiment

Figure 8:
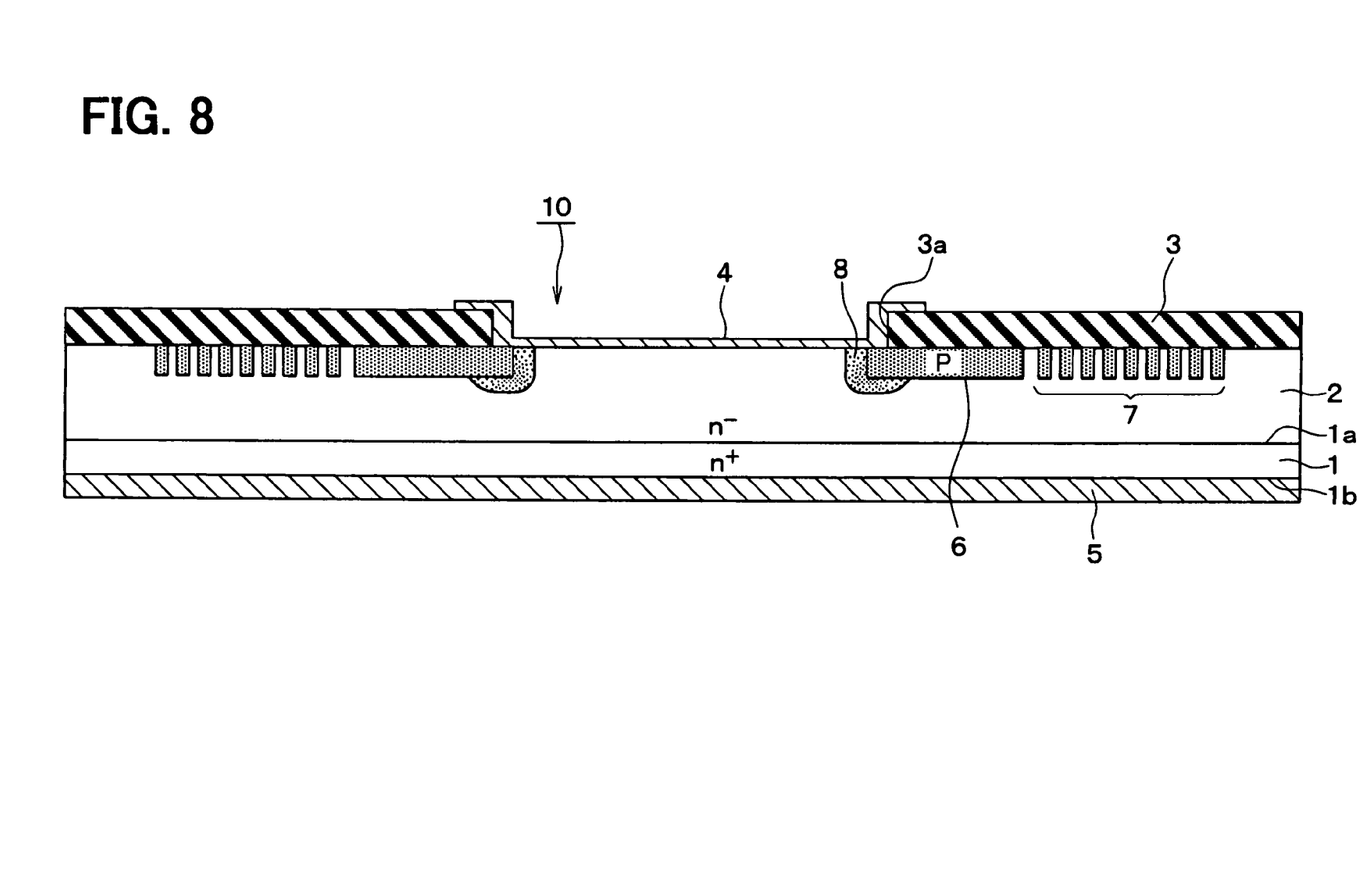
FIG. 8 is a cross sectional view showing a SiC semiconductor device having a SBD according to a fifth embodiment.

FIG. 8 shows a SiC semiconductor device having the SBD 10. The relaxation layer 8 having the ring shape is disposed on an inner side of the RESURF layer 6. The relaxation layer 8 surrounds the inner edge of the RESURF layer 6. The relaxation layer 8 is formed such that a P conductive type impurity is implanted, and then, the heat treatment is performed so that the impurity is diffused. In this case, a boron is used as the impurity because the boron is easily diffused. The impurity concentration of the relaxation layer 8 dilutes from the center of the relaxation layer 8 to a periphery of the relaxation layer 8.

In this case, when the reverse voltage is applied to the device, the electric field extends widely under the relaxation layer 8 and in the inside of the relaxation layer 8. Thus, the electric field relaxation is obtained, so that the breakdown voltage is improved.

The above device is formed by a process shown in FIGS. 3A to 3E except for a step shown in FIG. 3C. In a step corresponding to FIG. 3C, when the impurity is implanted for forming the relaxation layer 8, a boron instead of Al is used as the impurity. Then, in a step of heat treatment, the boron is diffused widely.

(Modifications)

A relaxation layer 8 may be provided by a combination of the relaxation layer 8 shown in FIGS. 1, 4, 5, 6 and 8. For example, each of the concentric layers shown in FIG. 4 having various depths may have an impurity concentration profile shown in FIG. 5.

Figure 9:
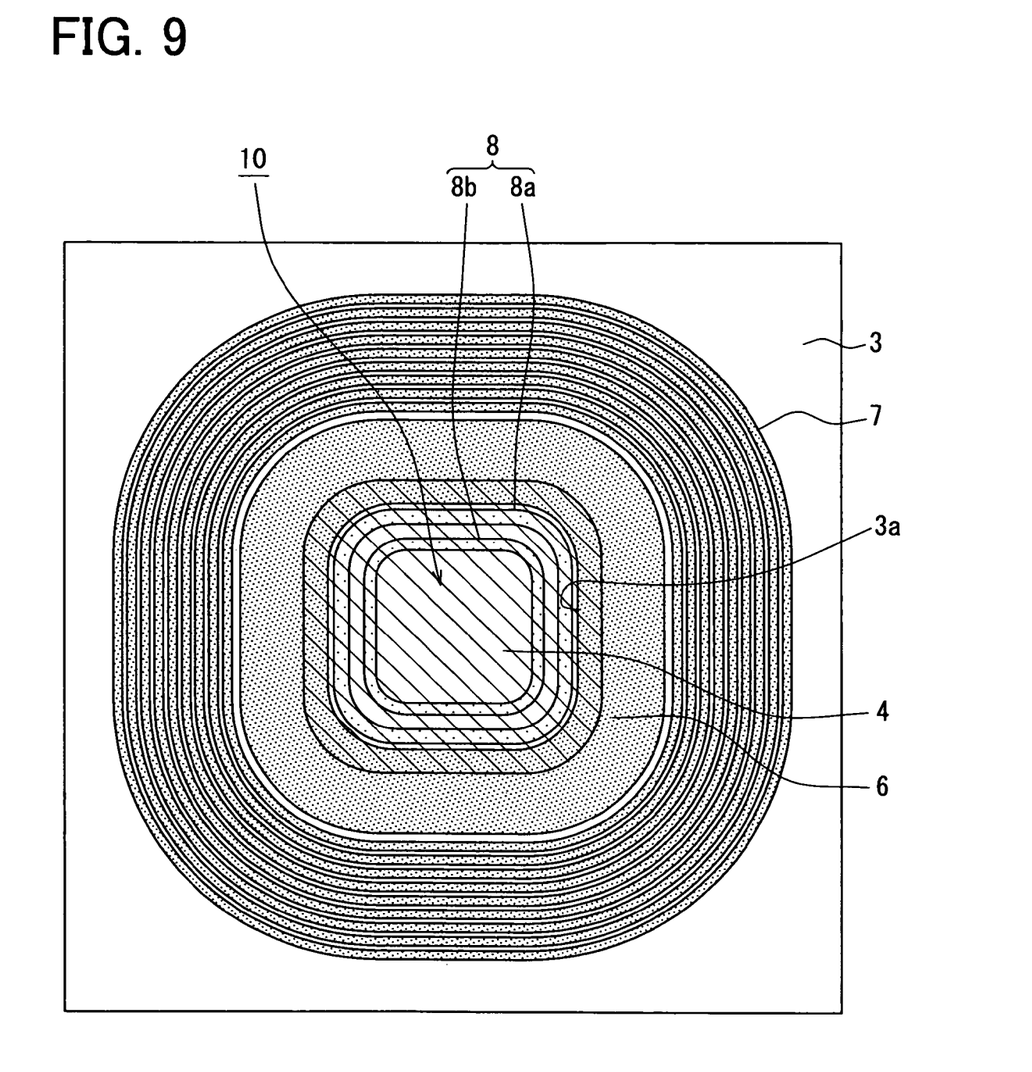
FIG. 9 is a plan view showing a SiC semiconductor device according to a modification of the first embodiment.

The number of concentric layers 8a, 8b may be three or more. Although the device shown in FIG. 2 has a circular plane shape, the device may have another shape. For example, the relaxation layer 8 and the RESURF layer 6 may have a square shape having rounded corners, as shown in FIG. 9.

The device has the SBD 10 in the cell region. Alternatively, the device may have a PN diode, MOSFET, IGBT or the like. In these cases, since the outer end structure has the above feature shown in FIGS. 1-8, the breakdown voltage of the device is improved. Although the first conductive type is the N conductive type, and the second conductive type is the P conductive type, the first conductive type may be the P conductive type, and the second conductive type may be the N conductive type.

Although the relaxation layer 8 is formed from the surface of the drift layer 2 to a predetermined depth of the drift layer 2, the relaxation layer 8 may be formed from a predetermined depth of the drift layer 2 to another predetermined depth of the drift layer 2 so that the relaxation layer 8 is not disposed on the surface of the drift layer 2.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
    a substrate made of SiC and having a first conductive type, wherein the substrate includes a first surface and a second surface;
    a drift layer disposed on the first surface of the substrate, wherein the drift layer is made of SiC and has the first conductive type, and the drift layer has an impurity concentration lower than an impurity concentration of the substrate;
    a semiconductor element disposed in a cell region of the drift layer;
    an outer periphery structure disposed on an outer periphery of the cell region, wherein the outer periphery structure includes a reduced surface field (RESURF) layer having a second conductive type, and the RESURF layer is disposed in a surface portion of the drift layer and surrounds the cell region; and an electric field relaxation layer having the second conductive type, wherein the electric field relaxation layer is disposed in another surface portion of the drift layer so that the electric field relaxation layer is separated from the RESURF layer, the electric field relaxation layer is disposed on an inside of the RESURF layer so that the electric field relaxation layer is disposed in the cell region, and the electric field relaxation layer has a ring shape, wherein the electric field relaxation layer includes a plurality of concentric layers, each of which is disposed on the inside of the RESURF layer, the plurality of concentric layers are spaced apart from each other, the plurality of concentric layers includes an utmost outer concentric layer, which is disposed on utmost outer side of the electric field relaxation layer, the utmost outer concentric layer contacts an edge of the RESURF layer, the edge of the RESURF layer is disposed on utmost inner side of the RESURF layer, each concentric layer has a width in a range between 0.5 μm and 2.0 μm, a distance between two adjacent concentric layers is in a range between 0.5 μm and 2.5 μm, each concentric layer has a depth in a range between 0.3 μm and 1.0 μm, the semiconductor element is one of a Schottky barrier diode (SBD), a PN diode, a metal oxide semiconductor field effect transistor (MOSFET), and an insulated gate bipolar transistor (IGBT), the outer periphery structure further includes a guard ring layer, the guard ring layer has the second conductive type, the guard ring layer is disposed in further another surface portion of the drift layer and surrounds the RESURF layer, and the electric field relaxation layer has a depth, which is equal to a depth of the guard ring layer and a depth of the RESURF layer.

2. The device according to claim 1, wherein
the electric field relaxation layer has an impurity concentration, which is larger than an impurity concentration of the RESURF layer.

3. The device according to claim 1, wherein
the electric field relaxation layer has an impurity concentration in a range between $5 \times 10^{17}$ cm$^{-3}$ and $5 \times 10^{20}$ cm$^{-3}$.

4. The device according to claim 3, wherein
the impurity concentration of the substrate is in a range between $2 \times 10^{18}$ cm$^{-3}$ and $1 \times 10^{21}$ cm$^{-3}$,
the impurity concentration of the drift layer is in a range between $1 \times 10^{15}$ cm$^{-3}$ and $5 \times 10^{16}$ cm$^{-3}$, and
the impurity concentration of the RESURF layer is in a range between $5 \times 10^{16}$ cm$^{-3}$ and $1 \times 10^{18}$ cm$^{-3}$.

5. The device according to claim 1, wherein
the electric field relaxation layer has an impurity concentration profile in such a manner that an impurity concentration of the electric field relaxation layer becomes smaller as a depth of the electric field relaxation layer becomes larger.

6. A SiC semiconductor device comprising:
a substrate made of SiC and having a first conductive type, wherein the substrate includes a first surface and a second surface;
a drift layer disposed on the first surface of the substrate, wherein the drift layer is made of SiC and has the first conductive type, and the drift layer has an impurity concentration lower than an impurity concentration of the substrate;
a semiconductor element disposed in a cell region of the drift layer;
an outer periphery structure disposed on an outer periphery of the cell region, wherein the outer periphery structure includes a reduced surface field (RESURF) layer having a second conductive type, and the RESURF layer is disposed in a surface portion of the drift layer and surrounds the cell region; and
an electric field relaxation layer having the second conductive type, wherein the electric field relaxation layer is disposed in another surface portion of the drift layer so that the electric field relaxation layer is separated from the RESURF layer, the electric field relaxation layer is disposed on an inside of the RESURF layer so that the electric field relaxation layer is disposed in the cell region, and the electric field relaxation layer has a ring shape, wherein
the electric field relaxation layer includes a plurality of concentric layers, each of which is disposed on the inside of the RESURF layer,
the plurality of concentric layers are spaced apart from each other,
the plurality of concentric layers includes an utmost outer concentric layer, which is disposed on utmost outer side of the electric field relaxation layer,
the utmost outer concentric layer contacts an edge of the RESURF layer,
the edge of the RESURF layer is disposed on utmost inner side of the RESURF layer,
each concentric layer has a width in a range between 0.5 μm and 2.0 μm,
a distance between two adjacent concentric layers is in a range between 0.5 μm and 2.5 μm,
the semiconductor element is one of a Schottky barrier diode (SBD), a PN diode,
a metal oxide semiconductor field effect transistor (MOSFET), and an insulated gate bipolar transistor (IGBT),
the outer periphery structure further includes a guard ring layer,
the guard ring layer has the second conductive type,
the guard ring layer is disposed in further another surface portion of the drift layer and surrounds the RESURF layer, and
the electric field relaxation layer has a depth, which is equal to a depth of the guard ring layer and a depth of the RESURF layer, wherein
each concentric layer has a depth, and a depth of a concentric layer disposed on an inner side of the electric field relaxation layer is shallower than a depth of a concentric layer disposed on an outer side of the electric field relaxation layer.

* * * * *